United States Patent
Morikawa

(10) Patent No.: US 7,675,344 B2
(45) Date of Patent: Mar. 9, 2010

(54) LEVEL SHIFTER

(75) Inventor: Koichi Morikawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/051,903

(22) Filed: Mar. 20, 2008

(65) Prior Publication Data

US 2008/0246530 A1    Oct. 9, 2008

(30) Foreign Application Priority Data

Apr. 9, 2007    (JP) ............................. 2007-101455

(51) Int. Cl.
*H03L 5/00*    (2006.01)
(52) U.S. Cl. ................... 327/333; 365/189.11
(58) Field of Classification Search ................. 327/333; 365/189.11; 326/68, 80, 81
See application file for complete search history.

(56) References Cited

U.S. PATENT DOCUMENTS 5,659,258 A  *  8/1997  Tanabe et al. ................. 326/68

FOREIGN PATENT DOCUMENTS

JP        2006135712       5/2006

* cited by examiner

*Primary Examiner*—Lincoln Donovan
*Assistant Examiner*—Sibin Chen
(74) *Attorney, Agent, or Firm*—Volentine & Whitt, P.L.L.C.

(57) ABSTRACT

A level shifter that prevents through currents thereat, including a holding circuit having an inverter made up of transistors connected between an internal node and a ground potential and an inverter made up of transistors connected between an internal node and the ground potential. These inverters are connected in loop form thereby to hold signals of nodes. Thus, even when input signals complementary to each other originally are both brought to a level "L", the signals of the nodes are held at the immediately preceding level, thus making it possible to prevent through currents from flowing through the transistors respectively.

3 Claims, 2 Drawing Sheets

LEVEL SHIFTER

BACKGROUND OF THE INVENTION

The present invention relates to a level shifter that converts a digital signal having a predetermined voltage level to a digital signal having a voltage different therefrom and outputs the converted digital signal.

FIG. 2 is a configuration diagram of a conventional or prior art level shifter described in a patent document 1 (Japanese Unexamined Patent Publication No. 2006-135712).

The level shifter comprises P-channel MOS type transistors P1 through P6, and N-channel MOS type transistors N1 through N4.

The sources of the transistors P1 and P2 are connected to a relatively higher source potential VDD. The gates thereof are connected to nodes n2 and n1, and the drains thereof are connected to nodes n3 and n4, respectively. The sources of the transistors P3 and P4 are respectively connected to the nodes n3 and n4, and the drains thereof are respectively connected to a ground potential GND via the transistors N1 and N2. The sources of the transistors P5 and P6 are respectively connected to the nodes n3 and n4, and the drains thereof are respectively connected to the ground potential GND via the transistors N3 and N4. Incidentally, a connecting point of the transistors P5 and N3 is configured as the node n1, and a connecting point of the transistors P6 and N4 is configured as the node n2.

The gates of the transistors P3, P5, N1 and N3 are supplied with a digital input signal IN corresponding to a relatively lower source potential VCC in common. An input signal INB obtained by inverting the input signal IN is supplied to the gates of the transistors P4, P6, N2 and N4 in common. A digital output signal OUT corresponding to the source potential VDD is outputted from a connecting point of the transistors P3 and N1. An output signal OUTB obtained by inverting the output signal OUT is outputted from a connecting point of the transistors P4 and N2.

The operation of the level shifter will next be explained.

Firstly, when the input signals IN and INB are stable at levels "L" and "H" respectively, the transistors P3, P5, N2 and N4 are held ON and the transistors P4, PG, N1 and N3 are held OFF. Thus, the node n2 is brought to "L" so that the transistor P1 is turned ON, and the node n1 is brought to "H" so that the transistor P2 is turned OFF. Signals of "H" and "L" having levels corresponding to the source potential VDD are respectively outputted as the output signals OUT and OUTB.

Now, when the input signal IN changes from "L" to "H" and the input signal INB changes from "H" to "L", respectively, the transistors P3, P5, N2 and N4 are changed to OFF and the transistors P4, P6, N1 and N3 are changed to ON, respectively. With the turning ON and OFF of the transistors N1 and P3 respectively, the output signal OUT changes from "H" to "L". With the turning ON and OFF of the transistors N3 and P5 respectively, the potential of the node n1 is reduced to the ground potential GND.

On the other hand, since the potential of the node n2 depends upon the state (i.e., the potential of the node n1) of the transistor P2 even though the transistors N4 and P6 are respectively brought to OFF and ON, its potential remains unchanged until the potential of the node n1 is sufficiently lowered. When the potential of the node n1 is sufficiently reduced, the transistor P2 is turned ON, so that the potential of the node n4 rises to the source potential VDD. Thus, the output signal OUTB changes from "L" to "H". The potential of the node n2 also rises so that the transistor P1 is turned OFF.

Next, when the input signal IN changes from "H" to "L" and the input signal INB changes from "L" to "H", respectively, the transistors P3, P5, N2 and N4 are changed to ON and the transistors P4, P6, N1 and N3 are changed to OFF, respectively. With the turning ON and OFF of the transistors N2 and P4 respectively, the output signal OUTB changes from "H" to "L". With the turning ON and OFF of the transistors N4 and P6 respectively, the potential of the node n2 is reduced to the ground potential GND.

On the other hand, since the potential of the node n1 depends on a state (i.e., the potential of the node n2) of the transistor P1 even when the transistors N3 and P5 are respectively brought to OFF and ON, the potential thereof remains unchanged until the potential of the node n2 is sufficiently reduced. When the potential of the node n2 is sufficiently reduced, the transistor P1 is turned ON so that the potential of the node n3 rises to the source potential VDD. Thus, the output signal OUT changes from "L" to "H". The potential of the node n1 also rises so that the transistor P2 is turned OFF.

Since the output circuits for outputting the output signals OUT and OUTB to external circuits respectively, and the nodes n1 and n2 for controlling internal states are separated from one another in the level shifter, the nodes n1 and n2 can respectively be brought to "L" by voltage drops developed across source-to-drain resistances of the transistors P5 and P6 regardless of the sizes of the transistors P1, P2, N3 and N4. As a result, drive capacities of the transistors P1 through P4, N1 and N2 can be enhanced, thus making it possible to increase an operating speed.

FIG. 3 is a configuration diagram showing one example of a system using a level shifter.

The system shows an example in which a signal from a peripheral circuit operated at a low source potential VCC is inputted to a microcomputer operated at a relatively high source potential VDD. A level shifter is provided at an input unit of the microcomputer. A digital signal IN of a VCC level outputted from the peripheral circuit is supplied to the level shifter, where it is converted into a digital signal of a VDD level, followed by being inputted to a core circuit of the microcomputer.

Such a system needs not to always operate depending upon the type of peripheral circuit. There is also known one that may operate only when started up from the microcomputer. In such a case, such a peripheral circuit that is brought to an active state only when started up from the microcomputer and brought to a standby state in which it has ceased operating when the operation thereof is unnecessary, has been used to reduce power consumption.

In recent years, the threshold voltage of each transistor has been lowered according to a strong demand for a reduction in power and a reduction in source voltage, whereby an off-leakage current in a standby state turns into a problem. As a method of reducing the off-leakage current, there has been adopted a method for switching a source potential VCC to a ground potential GND to stop the supply of power to a peripheral circuit during standby. In such a case, the potential of a digital signal IN supplied from the peripheral circuit to a level shifter is also switched to the ground potential GND.

When the input signals IN and INB are both brought to the ground potential GND in the level shifter shown in FIG. 2, the transistors P3 through P6 are turned ON simultaneously, and the transistors N1 through N4 are turned OFF simultaneously. Therefore, the transistors P1 and P2 are turned OFF simultaneously, and the output signals OUT and OUTB and the potentials of the nodes n1 and n2 are respectively brought to an instable intermediate potential, thereby causing through currents that flow from the transistors P1 and P2 to the transistors N1 through N4. A problem arises in that degradation in the lifetime of each transistor occurs in addition to the generation of needless power consumption due to the through currents, thereby impairing reliability.

SUMMARY OF THE INVENTION

The present invention has been made in view of the foregoing. It is therefore an object of the present invention to prevent through currents at a level shifter.

According to one aspect of the present invention, for attaining the above object, there is provided a level shifter comprising a first transistor of a first conductivity-type connected between a first source potential and a first internal node and ON/OFF-controlled by a signal of a second control node, a second transistor connected of the first conductivity-type between the first source potential and a second internal node and ON/OFF-controlled by a signal of a first control node, a third transistor of the first conductivity-type connected between the first internal node and a first output node and ON/OFF-controller by an input signal corresponding to a second source potential, a first transistor of a second conductivity-type connected between the first output node and a ground potential and ON/OFF-controlled by the input signal, a fourth transistor of the first conductivity-type connected between the second internal node and a second output node and ON/OFF-controlled by an inverse input signal obtained by inverting the input signal, a second transistor of the second conductivity-type connected between the second output node and the ground potential and ON/OFF-controlled by the inverse input signal, a fifth transistor of the first conductivity-type connected between the first internal node and the first control node and ON/OFF-controlled by the input signal, a third transistor of the second conductivity-type connected between the first control node and the ground potential and ON/OFF-controlled by the input signal, a sixth first conductivity-type transistor connected between the second internal node and the second control node and ON/OFF-controlled by the inverse input signal, a fourth transistor of the second conductivity-type connected between the second control node and the ground potential and ON/OFF-controlled by the inverse input signal, and a holding circuit which holds the signals of the first control node and the second control node and which, even when the input signal and the inverse input signal are both brought to the ground potential, maintains the signals and outputs the same to the first control node and the second control node.

A level shifter of the present invention is provided with a holding circuit that maintains and outputs signals of first and second control nodes even when an input signal and an inverse input signal obtained by inverting the input signal are both brought to a ground potential. Thus, advantageous effects are brought about in that even when power for a peripheral circuit or the like operated at a second source potential is stopped and thereby the input signal and the inverse input signal are both brought to the ground potential, the signals of the control nodes remain stable, thus making it possible to prevent through currents from being brought into a flowing state.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

The above and other objects and novel features of the present invention will become more completely apparent from the following descriptions of preferred embodiments when the same is read with reference to the accompanying drawings. The drawings, however, are for the purpose of illustration only and by no means limitative of the scope of the invention.

First Preferred Embodiment

Figure 1:
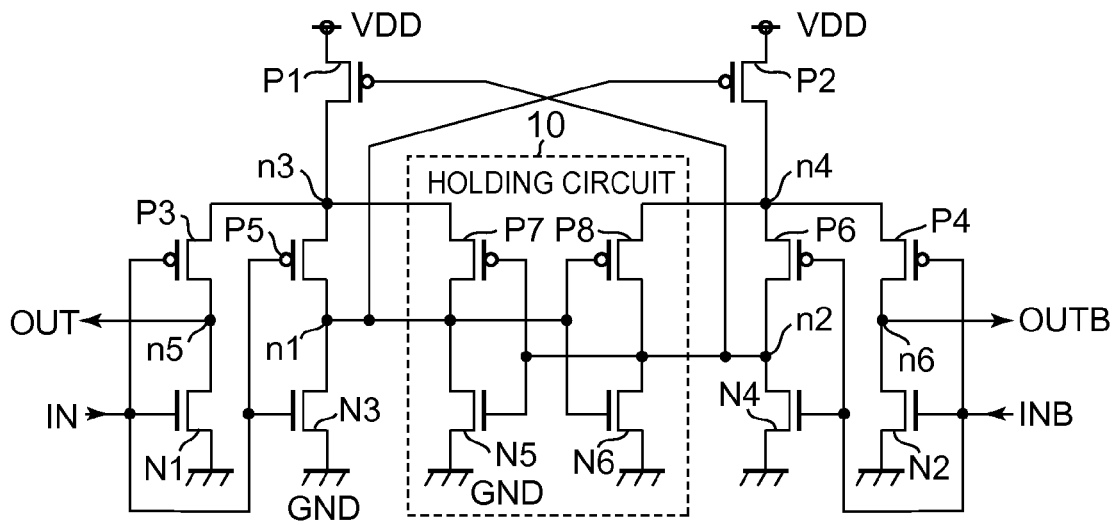
FIG. 1 is a configuration diagram of a level shifter showing a first embodiment of the present invention.

FIG. 1 is a configuration diagram of a level shifter showing a first embodiment of the present invention. Common reference numerals are respectively attached to elements common to those shown in FIG. 2.

Figure 2:
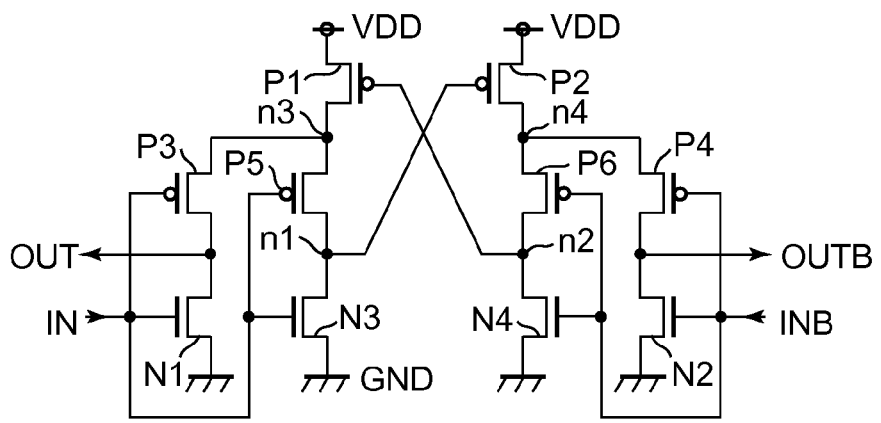
FIG. 2 is a configuration diagram of a prior art level shifter.
Figure 3:
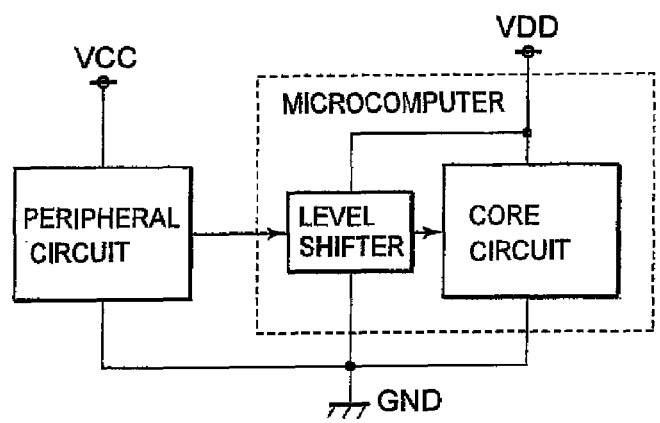
FIG. 3 is a configuration diagram showing one example of a system using a level shifter.

In addition to P channel MOS type transistors P1 through P6 and N channel MOS type transistors N1 through N4 similar to FIG. 2, the level shifter is constituted of a holding circuit 10 which holds the potentials of nodes n1 and n2 corresponding to control nodes even when input signals IN and INB are both brought to "L".

That is, the sources of the transistors P1 and P2 are connected to a relatively higher source potential VDD. The gates thereof are connected to nodes n2 and n1, and the drains thereof are connected to nodes n3 and n4 corresponding to internal nodes, respectively. The sources of the transistors P3 and P4 are respectively connected to the nodes n3 and n4, and the drains thereof are respectively connected to a ground potential GND via the transistors N1 and N2. The sources of the transistors P5 and P6 are respectively connected to the nodes n3 and n4, and the drains thereof are respectively connected to the ground potential GND via the transistors N3 and N4. Incidentally, a connecting point of the transistors P5 and N3 is configured as the node n1, and a connecting point of the transistors P6 and N4 is configured as the node n2.

The gates of the transistors P3, P5, N1 and N3 are supplied with a digital input signal IN corresponding to a relatively lower source potential VCC in common. An input signal INB obtained by inverting the input signal IN is supplied to the gates of the transistors P4, PG, N2 and N4 in common. A digital output signal OUT corresponding to the source potential VDD is outputted from a node n5 corresponding to a connecting point (output node) of the transistors P3 and N1. An output signal OUTB obtained by inverting the output signal OUT is outputted from a node n6 corresponding to a connecting point (output node) of the transistors P4 and N2.

The holding circuit 10 comprises P channel MOS type transistors P7 and P8 and N channel MOS type transistors N5 and N6. The sources of the transistors P7 and P8 are respectively connected to the nodes n3 and n4, and the drains thereof are respectively connected to the nodes n1 and n2. The drains of the transistors N5 and N6 are respectively connected to the nodes n1 and n2, and the sources thereof are connected to the ground potential GND. Further, the gates of the transistors P7 and N5 are connected to the node n2, and the gates of the transistors P8 and N6 are connected to the node n1.

That is, the holding circuit 10 is configured in such a manner that an inverter comprising the transistors P1, P7 and N5 and an inverter comprising the transistors P2, P8 and N6 are formed together with the transistors P1 and P2, and these two inverters are connected to each other in loop form, thereby maintaining and outputting the levels of the nodes n1 and n2.

The operation of the level shifter will next be explained.

The operations of the transistors P1 through P6 and N1 through N4 in an active state of the level shifter are similar to the conventional level shifter.

That is, when the complementary input signals IN and INB are stable at "L" and "H" respectively, the transistors P3, P5, N2 and N4 are held ON and the transistors P4, P6, N1 and N3 are held OFF. Thus, the node n2 is brought to "L" so that the transistor P1 is turned ON, and the node n1 is brought to "H" so that the transistor P2 is turned OFF. Signals of "H" and "L" having levels corresponding to the source potential VDD are respectively outputted as the output signals OUT and OUTB. At this time, the transistors P7 and N6 provided in the holding circuit 10 are in an ON state and the transistors P8 and N5 are in an OFF state.

Now, when the input signal IN changes from "L" to "H" and the input signal INB changes from "H" to "L", respectively, the transistors P3, P5, N2 and N4 are changed to OFF and the transistors P4, P6, N1 and N3 are changed to ON, respectively. With the turning ON and OFF of the transistors N1 and P3 respectively, the output signal OUT changes from "H" to "L". With the turning ON and OFF of the transistors N3 and P5 respectively, the potential of the node n1 is reduced to the ground potential GND.

On the other hand, since the potential of the node n2 depends upon the state (i.e., the potential of the node n1) of the transistor P2 even though the transistors N4 and P6 are respectively brought to OFF and ON, its potential remains unchanged until the potential of the node n1 is sufficiently lowered. When the potential of the node n1 is sufficiently reduced, the transistor P2 is turned ON, so that the potential of the node n4 rises to the source potential VDD. Thus, the output signal OUTB changes from "L" to "H". The potential of the node n2 also rises so that the transistor P1 is turned OFF. Consequently, the transistors P7 and N6 provided in the holding circuit 10 change to an OFF state, and the transistors P8 and N5 change to an ON state, respectively.

When a peripheral circuit is brought to a standby state in this state and the input signal IN is also brought to "L" along with the input signal INB, the transistors P3 and P5 are also turned ON and the transistors N1 and N3 are turned OFF. Since, however, the transistor N5 provided in the holding circuit 10 remains in an ON state and does not change, the levels of the nodes n1 and n2 are respectively held at "L" and "H". Thus, the potentials of the node n1 and n2 do not reach an unstable intermediate potential respectively, and hence through currents that flow from the transistors P1 and P2 to the transistors N3 and N4 respectively do not occur.

Next, when the input signal IN changes from "H" to "L" and the input signal INB changes from "L" to "H", respectively, the transistors P3, P5, N2 and N4 are changed to ON and the transistors P4, P6, N1 and N3 are changed to OFF, respectively. With the turning ON and OFF of the transistors N2 and P4 respectively, the output signal OUTB changes from "H" to "L". With the turning ON and OFF of the transistors N4 and P6 respectively, the potential of the node n2 is reduced to the ground potential GND.

On the other hand, since the potential of the node n1 depends on a state (i.e., the potential of the node n2) of the transistor P1 even when the transistors N3 and P5 are respectively brought to OFF and ON, the potential thereof remains unchanged until the potential of the node n2 is sufficiently reduced. When the potential of the node n2 is sufficiently reduced, the transistor P1 is turned ON so that the potential of the node n3 rises to the source potential VDD. Thus, the output signal OUT changes from "L" to "H". The potential of the node n1 also rises so that the transistor P2 is turned OFF. Consequently, the transistors P7 and N6 provided in the holding circuit 10 are changed to an ON state, and the transistors P8 and N5 are changed to an OFF state, respectively.

When the peripheral circuit is brought to the standby state in this state and the input signal INB is also brought to "L" along with the input signal IN, the transistors P4 and P6 are also turned ON and the transistors N2 and N4 are turned OFF. Since, however, the transistor N6 provided in the holding circuit 10 remains in an ON state and does not change, the levels of the nodes n1 and n2 are respectively held at "H" and "L". Thus, the potentials of the node n1 and n2 do not reach an instable intermediate potential respectively, and hence through currents that flow from the transistors P1 and P2 to the transistors N3 and N4 respectively are not produced.

According to the level shifter of the first embodiment as described above, there is provided the holding circuit 10 for holding the levels of the nodes n1 and n2 which control the states of the internal transistors even when the complementary input signals IN and INB are both brought to "L". Thus, the level shifter brings about advantages in that when the peripheral circuit is brought to the standby state, it is possible to prevent the occurrence of through currents flowing through the level shifter and suppress the occurrence of needless power consumption due the through currents and deterioration in the reliability due to degradation of each transistor.

Second Preferred Embodiment

Figure 4:
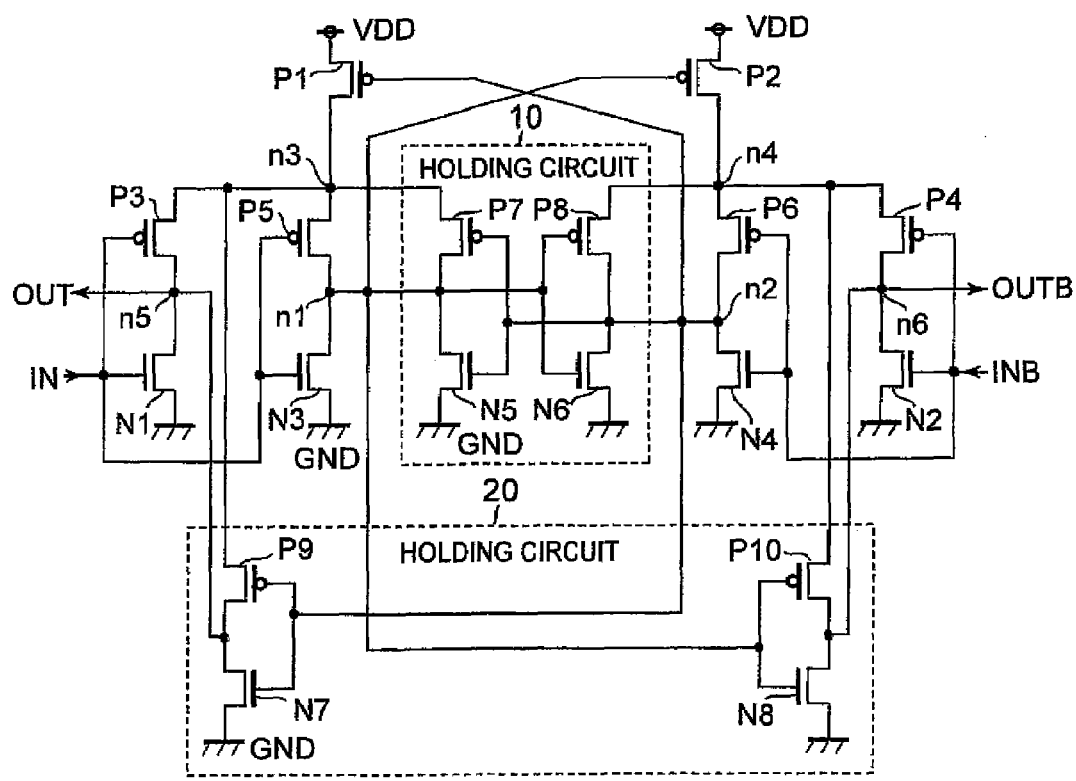
FIG. 4 is a configuration diagram of a level shifter showing a second embodiment of the present invention.

FIG. 4 is a configuration diagram of a level shifter showing a second embodiment of the present invention. Common reference numerals are attached to elements common to those shown in FIG. 1.

The present level shifter is configured as one in which a holding circuit 20 for holding potentials of complementary output signals OUT and OUTB even when input signals IN and INB are both brought to "L", is added to the level shifter shown in FIG. 1.

The holding circuit 20 comprises P channel MOS type transistors P9 and P10 and N channel MOS type transistors N7 and N8. The sources of the transistors P9 and P10 are respectively connected to nodes n3 and n4, and the drains thereof are respectively connected to nodes n5 and n6. The drains of the transistors N7 and N8 are respectively connected to the nodes n5 and n6, and the sources thereof are respectively connected to a ground potential GND. Further, the gates of the transistors P9 and N7 are respectively connected to a node n2, and the gates of the transistors P10 and N8 are connected to a node n1.

The operations of the transistors P1 through P6, N1 through N4 and holding circuit 10 in the level shifter are similar to the level shifter according to the first embodiment shown in FIG. 1.

On the other hand, the holding circuit 20 is formed with an inverter constituted of the transistors P1, P9 and N7 and an inverter constituted of the transistors P2, P10 and N8 along with the transistors P1 and P2. The levels of the nodes n1 and n2 are held by these two inverters, after which they are outputted to the nodes n5 and n6. Thus, since the potentials of the nodes n5 and n6 are held at the ground potential GND or source potential VDD even when the input signals IN and INB are both brought to "L", an instable intermediate potential is not reached, thereby causing no occurrence of through currents that flow from the transistors P1 and P2 to the transistors N1 and N2.

According to the level shifter of the second embodiment as described above, there are provided the holding circuit 10 for holding the levels of the nodes n1 and n2, which control the states of the internal transistors even when the complementary input signals IN and INB are both brought to "L", and the holding circuit 20 for holding the potentials of the nodes n5 and n6 at the ground potential GND or source potential VDD, based on the levels of the nodes n1 and n2 even in such a similar case. Thus, the level shifter brings about advantages in that when a peripheral circuit is brought to a standby state, the occurrence of through currents flowing through the level shifter can be prevented more reliably as compared with the first embodiment, and both the occurrence of needless power consumption due the through currents and deterioration in the reliability due to degradation in the lifetime of each transistor can be suppressed.

Incidentally, the present invention is not limited to the above embodiments. Various modifications can be made thereto. Although the above embodiment has described the example applied to the system in which the peripheral circuit, the microcomputer and the like operated at the different source voltages are combined, the present invention is applicable event to a level shifter used as a separation cell for separating region-to-region voltages every supply voltage at a SoC to which a Multi Supply Voltage technology is applied, as one of the above modifications, for example.

What is claimed is:

1. A level shifter comprising:
    a first transistor of a first conductivity-type connected between a first source potential and a first internal node and ON/OFF-controlled by a signal of a second control node;
    a second transistor of the first conductivity-type connected between the first source potential and a second internal node and ON/OFF-controlled by a signal of a first control node;
    a third transistor of the first conductivity-type connected between the first internal node and a first output node and ON/OFF-controller by an input signal corresponding to a second source potential:
    a first transistor of a second conductivity-type connected between the first output node and a around potential and ONIOFF-controlled by the input signal;
    a fourth transistor of the first conductivity-type connected between the second internal node and a second output node and ON/OFF-controlled by an inverse input signal obtained by inverting the input signal;
    a second transistor of the second conductivity-type connected between the second output node and the around potential and ON/OFF-controlled by the inverse input signal;
    a fifth transistor of the first conductivity-type connected between the first internal node and the first control node and ON/OFF-controlled by the input signal;
    a third transistor of the second conductivity-type connected between the first control node and the ground potential and ON/OFF-controlled by the input signal;
    a sixth transistor of the first conductivity-type connected between the second internal node and the second control node and ON/OFF-controlled by the inverse input signal;
    a fourth transistor of the second conductivity-type connected between the second control node and the around potential and ON/OFF-controlled by the inverse input signal; and
    a holding circuit which holds the signals of the first control node and the second control node and which, even when the input signal and the inverse input signal are both brought to the around potential, maintains and outputs the signals of the first control node and the second control node to the first control node and the second control node,
    wherein the holding circuit includes
        a seventh transistor of the first conductivity-type connected between the first internal node and the first control node and ON/OFF-controlled by the signal of the second control node,
        a fifth transistor of the second conductivity-type connected between the first control node and the ground potential and ON/OFF-controlled by the signal of the second control node,
        an eighth transistor of the first conductivity-type connected between the second internal node and the second control node and ON/OFF-controlled by the signal of the first control node, and
        a sixth transistor of the second conductivity-type connected between the second control node and the ground potential and ON/OFF-controlled by the signal of the first control node.

2. The level shifter according to claim 1, further including:
    a ninth transistor of the first conductivity-type connected between the first internal node and the first output node and ON/OFF-controlled by the signal of the second control node;
    a seventh transistor of the second conductivity-type connected between the first output node and the ground potential and ON/OFF-controlled by the signal of the second control node;
    a tenth transistor of the first conductivity-type connected between the second internal node and the second output node and ON/OFF-controlled by the signal of the first control node; and
    an eighth transistor of the second conductivity-type between the second output node and the ground potential and ON/OFF-controlled by the signal of the first control node.

3. The level shifter according to claim 1, wherein the first source potential is higher than the second source potential.

* * * * *